United States Patent
Pun

(10) Patent No.: US 8,326,576 B2
(45) Date of Patent: Dec. 4, 2012

(54) DETECTING POWER QUALITY EVENTS IN POWER DISTRIBUTION NETWORKS

(75) Inventor: Man-On Pun, Cambridge, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 158 days.

(21) Appl. No.: 12/650,368

(22) Filed: Dec. 30, 2009

(65) Prior Publication Data

US 2011/0161020 A1   Jun. 30, 2011

(51) Int. Cl.
*G06F 19/00* (2011.01)
*G06F 17/18* (2006.01)
*G01R 21/00* (2006.01)

(52) U.S. Cl. .......................... 702/181; 702/60
(58) Field of Classification Search .............. 702/60, 702/61, 65–77, 179, 181, 189, 194; 324/76.11, 324/76.15, 142
See application file for complete search history.

(56) References Cited

U.S. PATENT DOCUMENTS
7,050,913 B2 * 5/2006 Cox ........................... 702/60

OTHER PUBLICATIONS

Dwivedi et al. "Denoising Techniques With Change-Point Approach for Wavelet-Based Power-Quality Monitoring." IEEE Jul. 2009.*

* cited by examiner

Primary Examiner — Sujoy Kundu
(74) Attorney, Agent, or Firm — Dirk Brinkman; Gene Vinokur

(57) ABSTRACT

Power quality (PQ) events in a waveform in a power distribution network are detected by sampling the waveform. For each sample, a normalized sample is determined by subtracting an undistorted waveform from the sample. An accumulated weighted log-likelihood ratio (LLR) is determined for all normalized samples, as well as a minimum of the accumulated weighted LLR. If the difference between the accumulated weighted LLR an the minimum LLR is greater than a predetermined threshold, then the PQ event is signaled. The network can be a smart grid.

10 Claims, 7 Drawing Sheets

DETECTING POWER QUALITY EVENTS IN POWER DISTRIBUTION NETWORKS

FIELD OF THE INVENTION

This invention relates generally to monitoring power in power distribution networks, and more particularly to detecting power quality events.

BACKGROUND OF THE INVENTION

In the United States, power outages and power quality problems annually cost hundreds of billions each year. Being motivated by this concern, one of the defining characteristics of the emerging smart grid is to support more stable and higher-quality power supply by using information technology.

To assess power quality (PQ), it is a common practice to monitor the quality of voltage and current waveforms by analyzing samples acquired by sensors installed in the power distribution networks.

In contrast with the sinusoidal power waveform generated by electric utilities, power waveforms over transmission lines and at consumer equipment are often distorted. Generally, distortions can be classified a PQ variations and PQ events. While PQ variations are characterized by small and gradual deviations from the sinusoidal voltage and current waveforms, PQ events incur large waveform deviations. PQ events are more detrimental to the power distribution network because the events can potentially inflict severe damages to the electrical equipment and injuries the consumers. Consequently, the occurrence of the PQ events has to be detected accurately and timely to allow appropriate actions.

In practice, PQ event monitoring includes detection and classification. During detection, a PQ event is declared when the waveform distortion exceeds a pre-defined threshold. Then, the distorted waveform can be classified to identify the cause of the PQ event before further analysis is performed.

Three primary PQ event detection methods are known. The first method tracks the root mean squared (RMS) value of the voltage waveform over a moving time window. The likelihood of the occurrence of the PQ event is evaluated based on the RMS change across windows. The RMS-based method is effective in detecting amplitude-related distortions. The second method detects the distortion in the frequency domain by transforming the time waveform into a frequency waveform using either wavelets or a short-time Fourier transform (STFT). The third method decomposes the waveform into a sum of damped sinusoids using super-resolution spectral analysis techniques, such as signal estimation via rotational invariance techniques, or multiple signal classification. The distorted waveform is detected by comparing the decomposed frequency-domain components of a monitored waveform with those of the normal waveform.

The moving time window segments the waveform into blocks before any transformation or decomposition is applied. Therefore, the time resolution of all three conventional methods is restricted by the size of the moving window.

If the window size is sufficiently large to meet the detection rate and the false alarm rate requirements, the delay in detecting the PQ window is increased, and real-time detection is not possible.

The invention corrects this problem.

SUMMARY OF THE INVENTION

The embodiments of the invention provide a method and apparatus for detecting power quality (PQ) events in a waveform of a power distribution network. The method is based on change-point detection. Generally, change-point detection discovers time points in time series-samples at which properties of time-series samples change, such as changes in the waveform due to the PQ events.

The method uses a sequential cumulative sum (CUSUM) procedure for detecting the PQ events in real-time. The CUSUM procedure evaluates weighted likelihood ratios based on instantaneous and long-term samples of the power waveform. The invented method achieves a significant performance gain over conventional PQ event detection schemes.

DETAILED DESCRIPTION OF THE PREFERRED EMBODIMENTS

Figure 1:
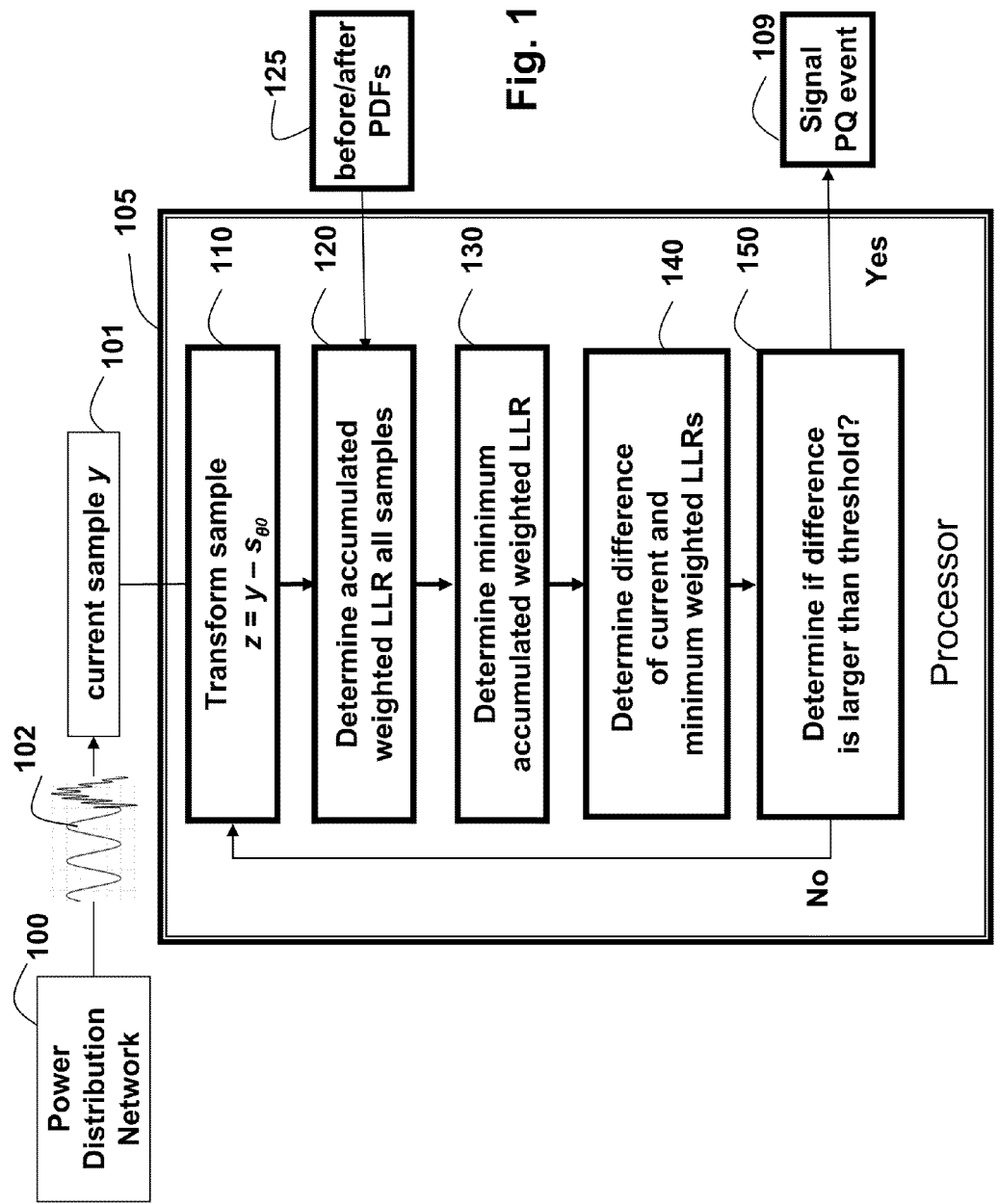
FIG. 1 is a block diagram of a method for detecting a power-quality (PQ) event in a waveform in a power distribution network according to embodiments of the invention.

The embodiments of the invention provide a method detecting a power quality (PQ) event in a waveform in a power distribution networks. In one embodiment the network is a smart grid. The method periodically samples the waveform.

If the PQ event occurs at time $t=t_e$, a goal of the method is to detect the PQ event with a minimum delay and a highest detection accuracy. The method can also to detect an end of the PQ event. The focus of this description is on detecting the start of the PQ event. It would be obvious to those of arinary skill in the art to extend the method to detecting the end of the event.

Waveform Before PQ Event

Samples of the continuous-time waveform before the PQ event are represented by $$y(t)=s_{\theta_0}(t)+n(t), 0 \leq t < t_e, \qquad (1)$$

where n(t) is additional white Gaussian noise (AWGN) with zero-mean and variance $\sigma_n^2$, denoted by $N(0,\sigma_n^2)$, and $$s_{\theta_0}(t)=a_0 \cdot \sin(2\pi f_0 t + \phi_0), \qquad (2)$$

is an undistorted power waveform with $\theta_0 \stackrel{def}{=} [a_0, f_0, \phi_0]^T$, where $a_0=1$ is a signal amplitude gain, and $f_0$ and $\phi_0$ are a fundamental frequency and an initial phase of the power waveform, respectively.

Waveform After PQ Event

Samples of the power waveform after the PQ event are represented by $$y(t)=s_{\theta_1}(t)+n(t), t \geq t_e, \qquad (3)$$

where $\theta_1 \stackrel{def}{=} [a_1, f_1, \phi_1, \phi^T]^T$ and $$s_{\theta_1}(t)=a_1 \cdot \sin(2\pi f_1 t + \phi_1) + \xi(t), \qquad (4)$$

with $\xi_\phi(t)$ being the additive distortion parameterized by $\phi$. Eq. (3) represents a generalized power waveform that takes a typical PQ events into consideration.

For example, voltage sags can be modeled as sudden decrease in the waveform amplitude gain with $a_1 < a_0$ while setting $\xi_\phi(t)=0$. In contrast, a transient voltage event can be described by non-zero $\xi_\phi(t)$ with $f_0=f_1$ and $\phi_0=\phi_1$.

A before probability density functions (PDF) $p_{\theta_0}(y)$ and an after PDF $p_{\theta_1}(y)$ represent the distribution of the sample y before and after the PQ event, respectively. The before PDF $p_{\theta_0}(y)$ can be estimated due to the fact that $\{a_0, f_0, \phi_0\}$ are deterministic and $\sigma_n^2$ can be accurately measured.

In contrast, the after PDF $p_{\theta_1}(y)$ depends on a specific type of PQ event. It is generally difficult to fully characterize the after PDF $p_{\theta_1}(y)$ before the occurrence of the PQ event. This is a problem for a conventional statistical hypothesis test methods that use Neyman-Pearson hypothesis testing.

As a result, most conventional PQ event detection methods are designed to only use the instantaneous changes in the waveform, such as changes in amplitude, frequency or phase without utilizing associated long-term statistics.

For example, the conventional RMS method concentrates on amplitude changes by sampling and determining the RMS of the waveform. Let $y_k$ be the k-th current sample of the waveform. The conventional RMS method tracks the RMS of the samples over a moving window of size N, where N usually covers one cycle of the power-system frequency. The m-th RMS is $$Y_{rms}(m) = \sqrt{\frac{1}{N} \sum_{k=m-N+1}^{m} y_k^2}.$$

Conventionally, the PQ event is detected when the current RMS value change is larger than a predetermined threshold. In addition to the time-resolution problem associated with the size of the moving window, conventional methods are sub-optimal due to the fact that they do not use statistical distributions of the samples before and after the PQ event.

The PQ event dection method according to embodiments of the invention uses a cumulative sum (CUSUM) procedure. The PDF $p_{\theta_0}(y)$ before the PQ event is known while the post-event PDF $p_{\theta_1}(y)$ needs to be determined. To circumvent the uncertainty of the after PDF, the weighted CUSUM procedure is used to replace the conventional log-likelihood ratio (LLR) test. In the following, $a_0=1$, $f_0$ is either 50 or 60 Hz, and $\phi_0$ and $\sigma_n^2$ are known.

PQ Event Detection Method

FIG. 1 shows the steps of the method for detecting and signaling a PQ event 109 in the waveform 102 of the power distribution network 100 according to embodiments of the invention. The steps of the method can be performed in a processor 105 including memory and input/output interfaces as known in the art. It is understood that the method can also be implemented in hardware, e.g., an application-specific integrated circuit (ASIC). The steps are performed for each current sample y 101 sensed by a sensor. The sensor can be designed to sample, voltage, amplitude, phase frequency or combinations thereof.

Pre-Event PDF

Because $\{a_0, f_0, \phi_0\}$ are known, the undistorted waveform $s_{\theta_0}$ before the PQ event is also known. Each sample 100 y(t) in Eq. (1) is transformed 110 into a normalized sample z(t) by subtracting the undistorted waveform from the current sample to obtain the normalized sample $$z(t)=y(t)-s_{\theta_0}(t)=n(t),\ 0 \leq t < t_e.\quad (6)$$

Thus, the before PDF of the normalized sample z is $$p_{\theta_0}(z)=N(0,\sigma_n^2),\quad (7)$$

Post-Event PDF

The after PDF is derived using a change-point detection procedure as known in the art, see generally U.S. Pat. No. 7,016,797 "Change point detection apparatus, method and program therefor," issued to Takeuchi et al. on Mar. 21, 2006, and incorporated herein by reference.

The change point detection procedure according to embodiments of the invention uses a weighted CUSUM procedure. Therefore, to obtain the normalized sample z(t), Eq. (3) is converted to subtract the undistorted wavefrom from the current sample according to $$z(t)=y(t)-s_{\theta_0}(t)=x(t)+w(t),\quad (8)$$

where $$x(t)=a_1 \cdot \sin(2\pi f_1 t + \phi_1),\quad (9)$$

$$w(t)=\xi_\phi(t)-s_{\theta_0}(t)+n(t).\quad (10)$$

Because the after $\theta_1$ is unknown, rather than evaluating the LLR ratio $$\frac{p_{\theta_1}(z_i)}{p_{\theta_0}(z_i)}$$

directly, the weighted LLR is determined with the weighted CUSUM method as $$s_i = \ln\left[\int_{\theta_1} \frac{p_{\theta_1}(z_i)}{p_{\theta_0}(z_i)} dF(\theta_1)\right],\quad (11)$$

The PDF of w of is approximated as $N(0,\sigma_n^2)$ using the well known central limit theorem, where $\sigma_w^2=\sigma_\xi^2+\sigma_n^2+a_0^2$. Furthermore, recall that x(t) is approximately uniformly distributed over $[-|a_1|,+|a_1|]$. Thus, it is straightforward to show that the after PDF of the normalized samples is $$p_{\theta_1}(z) = \frac{1}{4|a_1|}\left[\text{erf}\left(\frac{z+|a_1|}{\sqrt{2} \cdot \sigma_w}\right) - \text{erf}\left(\frac{z-|a_1|}{\sqrt{2} \cdot \sigma_w}\right)\right],\quad (12)$$

where erf is an error function.

With the assumption that x(t) and w(t) are statistically independent, $F(\theta_1)$ can be expressed as $$F(\theta_1)=F(a_1) \cdot F(\sigma_w).\quad (13)$$

As a result, the weighted LLR in Eq. (11) becomes $$s_i = \ln\left[\int_{a_1}\int_{\sigma_w} \frac{p_{\theta_1}(z_i)}{p_{\theta_0}(z_i)} dF(\sigma_w) dF(a_1)\right].\quad (14)$$

The distributions F(.) are generally in the form of a Gaussian distribution.

From the before and after PDFs in (7) and (12) respectively, the weighted LLR of the sample at time I can be evaluated according to Eq. (14).

From the LLR, the method 120 determines the accumulated weighted LLR for all samples as $$S_k = \sum_{i=1}^{k} s_i, \quad (15)$$

that is, the accumulation is from the first data sample i=1 to the current sample k. The accumulated weighted LLR is based on the ratios of the before and after PDFs 125.

Next, the method determines 130 a minimum of the accumulated weighted LLR $S_j$ for j=1, 2, ..., k as $$m_k = \min_{1 \leq j \leq k} S_j, \quad (16)$$

where the function min returns a minimum value.

Next, the method determines 140 a difference between the current accumulated weighted LLR and the minimum accumulated weighted LLR $$g_k = S_k - m_k. \quad (17)$$

Then, the method determines 150 if the difference $g_z$ is greater than a predetermined threshold h. If the difference $g_k$ is greater than the threshold, i.e., $g_k > h$, then the method signals a PQ event 109. Otherwise, the next sample is processed.

Figure 2:
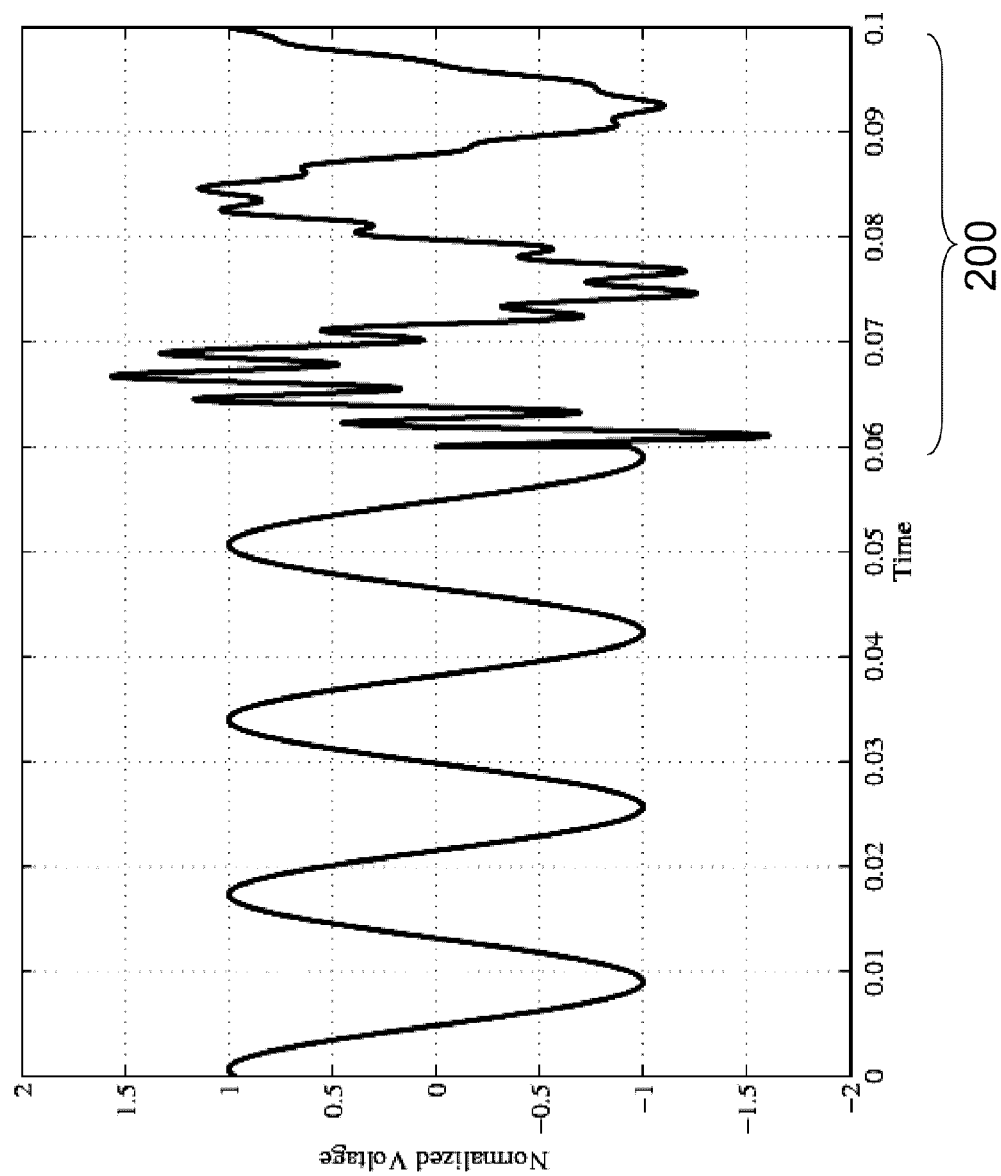
FIG. 2 is graph of a transient voltage event detected by the method according to embodiments of the invention.

FIG. 2 shows a transient voltage event 200 starting at ime $t_e$=0.06 s.

Figure 3:
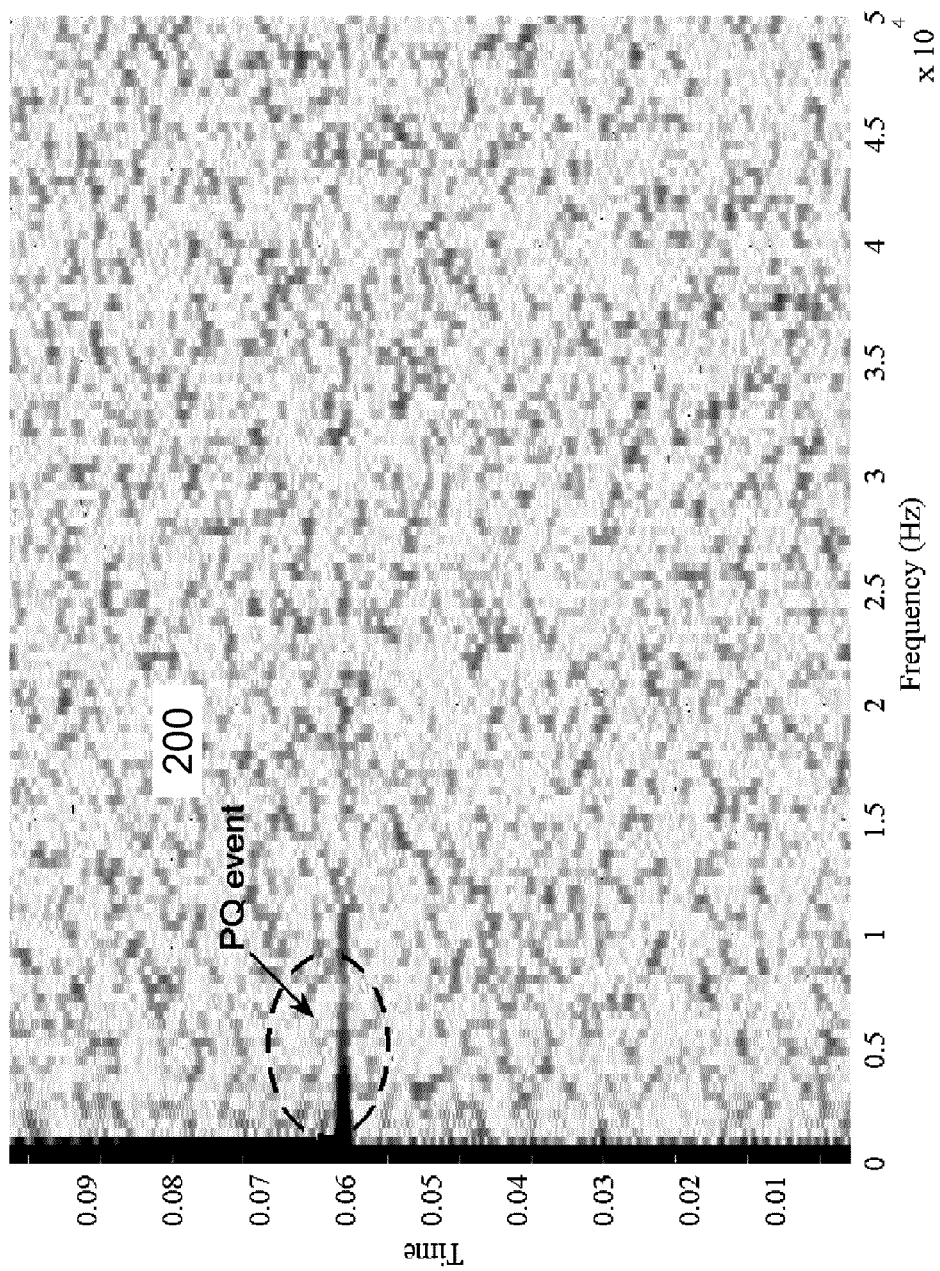
FIG. 3 is a graph of a temporal-frequency using SIFT with respect to the transient event detected according to embodiments of the invention.
Figure 4:
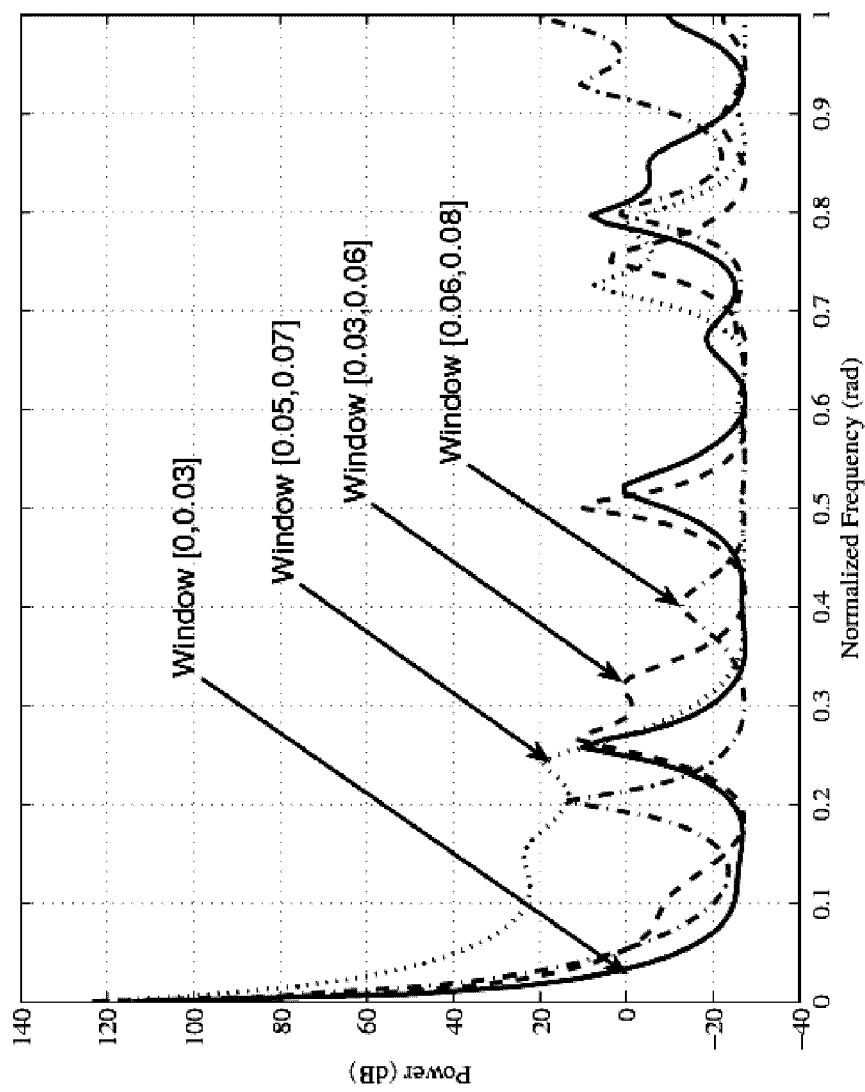
FIG. 4 is a conventional spectral estimates for a transient PQ event.

FIGS. 3 and 4 respectively show temporal-frequency plots using STFT and spectral estimates over multiple windows, respectively. As shown in FIGS. 3 and 4, it is difficult to detect the PQ event directly from these plots.

Figure 5:
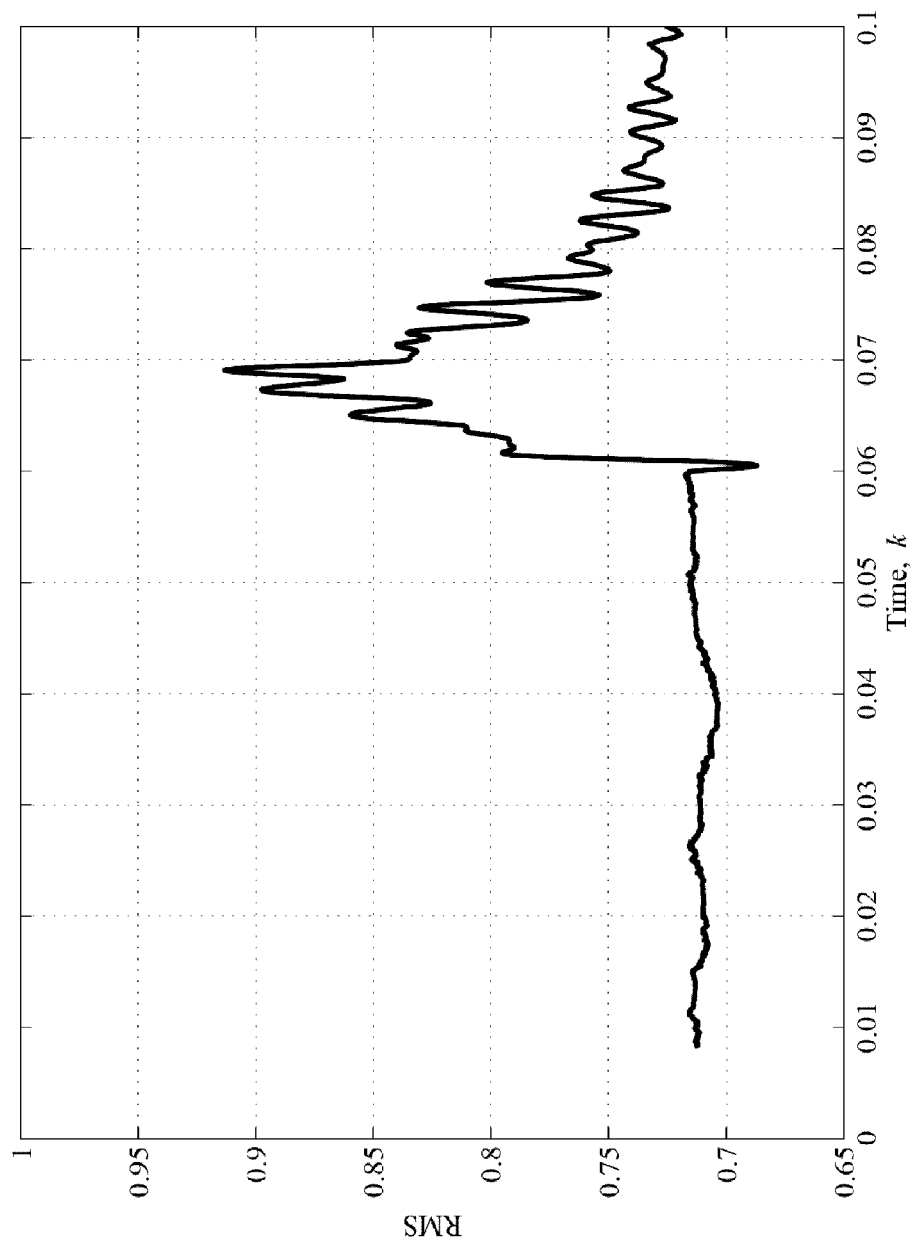
FIG. 5 is a graph of a conventional sample-by-sample RMS of the transient PQ event.
Figure 6:
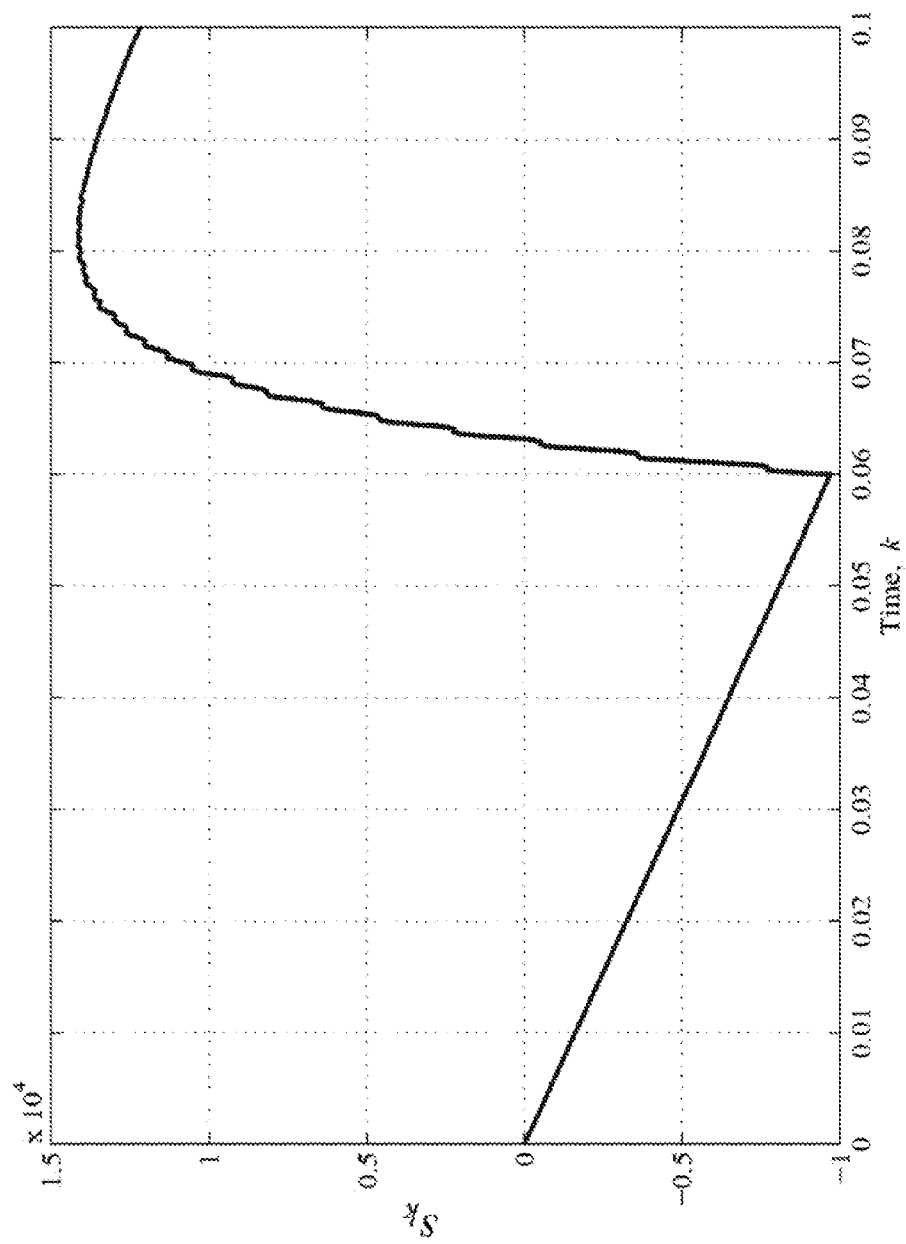
FIG. 6 is a graph of a logarithm of the weighted likelihood ratio of the transient PA event detected by the method according to embodiments of the invention.

FIGS. 5 and 6 show the sample-by-sample RMS generated by the conventional RMS scheme, and the logarithm of the weighted likelihood ratio by the CUSUM method according to the embodiments of the invention. The CUSUM method clearly has much stronger indication on the PQ event occurrence at t=0.06 s.

Voltage Sags

Figure 7:
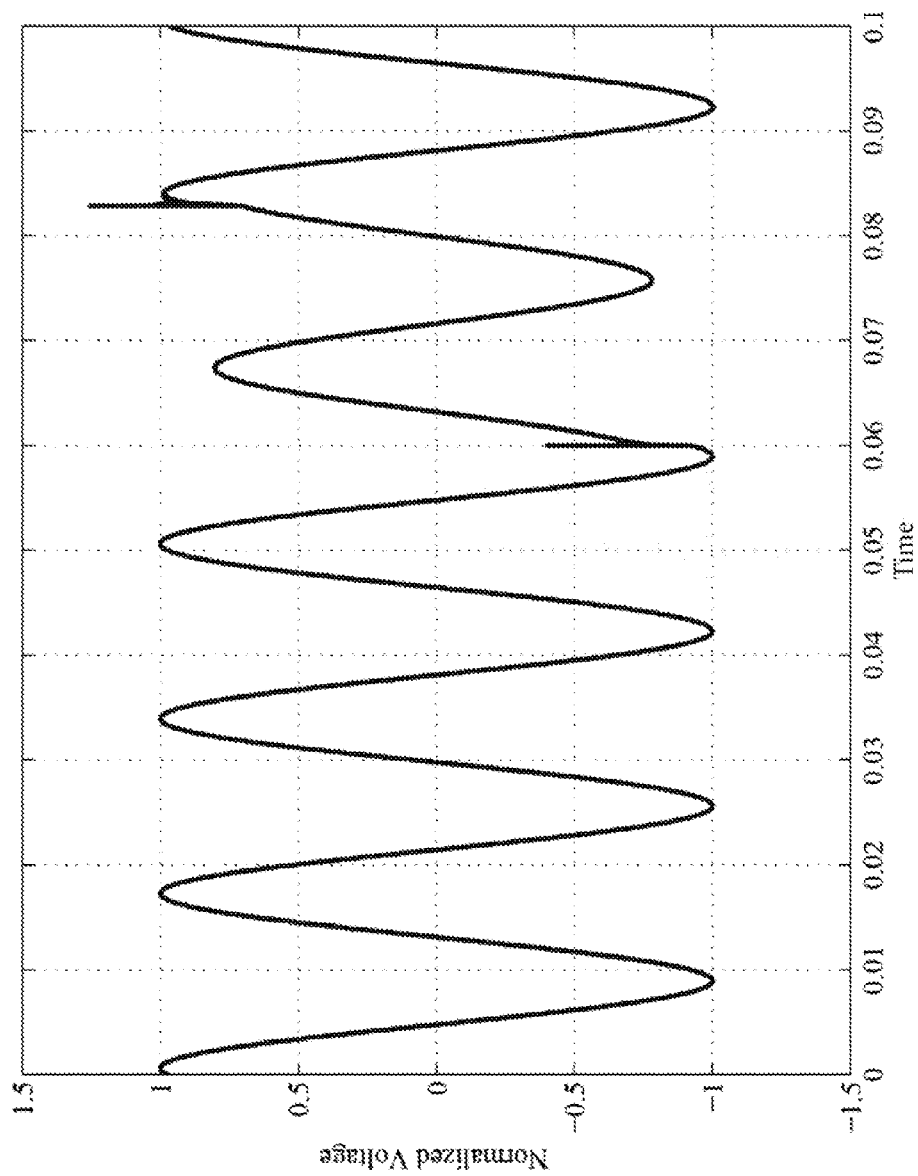
FIG. 7 is a graph of a voltage sag event detected by the method according to embodiments of the invention.

FIG. 7 shows a voltage sag detected by the method according to embodiments of the invention. The sag is due to a temporary ground fault.

EFFECT OF THE INVENTION

The invention provides a method for detecting a power quality event using a change-point detection theoretic framework. The method analysis a difference of statistical distributions of power waveforms before and after the PQ event occurrence. Because the proposed scheme performs sample-by-sample evaluation, it can achieve the detection task with the smallest time resolution. Furthermore, capitalizing on the change-point detection theory, the proposed scheme provides accurate detection performance, irrespective of the availability of the post-event statistical distribution. Although the change-point detection theory has been successfully applied to a wide variety of applications such as spectrum sensing in cognitive radio networks, as best s is known, the method according to the embodiments of the invention is the first use the change-point detection theory to the PQ monitoring problem.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

I claim:

1. A method for detecting a power quality (PQ) event in a waveform in a power distribution network by sampling the waveform, comprising for each sample the steps of:
    subtracting an undistorted waveform from the sample to obtain a normalized sample;
    determining an accumulated weighted log-likelihood ratio (LLR) for all normalized samples;
    determining a minimum of the accumulated weighted LLR;
    determining a difference between the accumulated weighted LLR and the minimum LLR;
    signaling the PQ event if the difference is greater than a predetermined threshold, where the steps are performed in a processor.

2. The method of claim 1, wherein the network is a smart grid.

3. The method of claim 1, wherein the accumulated weighted LLR uses change-point detection.

4. The method of claim 1, wherein the accumulated weighted LLR uses a sequential cumulative sum procedure.

5. The method of claim 1, wherein the samples of the waveform before the PQ event are represented by $$y(t) = s_{\theta_0}(t) + n(t), \quad 0 \leq t < t_e,$$

where n(t) is additional white Gaussian noise (AWGN) with zero-mean and a variance $\sigma_n^2$, denoted by $N(0, \sigma_n^2)$, and $$s_{\theta_0}(t) = a_0 \cdot \sin(2\pi f_0 t + \phi_0),$$

is an undistorted power waveform with $\theta_0 \stackrel{\text{def}}{=} [a_0, f_0, \phi_0]^T$, where $a_0=1$ is a signal amplitude gain, and $f_0$ and $\phi_0$ are a fundamental frequency and an initial phase of the waveform, respectively, and wherein the samples of the waveform after the PQ event are represented by $$y(t) = s_{\theta_1}(t) + n(t), \quad t \geq t_e,$$

where $\theta_1 \stackrel{\text{def}}{=} [a_1, f_1, \phi_1, \phi^T]^T$ and $$s_{\theta_1}(t) = a_1 \cdot \sin(2\pi f_1 t + \phi_1) + \xi_\phi(t),$$

with $\xi_\phi(t)$ being an additive distortion parameterized by $\phi$.

6. The method of claim 1, wherein the PQ event is a voltage sag.

7. The method of claim 1, further comprising:
    detecting an end of the PQ event.

8. The method of claim 5, wherein a before probability distribution function (PDF) of the samples before the PQ event is $p_{\theta_0}(y)$, and wherein the accumulated weighted LLR is based on the before PDF and the after PDF.

9. The method of claim 8, wherein the normalized sample $$z(t) = y(t) - s_{\theta_0}(t) = n(t), \quad 0 \leq t < t_e.$$

10. An apparatus for detecting a power quality (PQ) event in a waveform in a power distribution network, comprising:
    a sensor configured to sample the waveform;
    means for subtracting an undistorted waveform from each sample to obtain a normalized sample;
    means for determining an accumulated weighted log-likelihood ratio (LLR) for all normalized samples;
    means for determining a minimum of the accumulated weighted LLR;
    means for determining a difference between the accumulated weighted LLR and the minimum LLR; and
    means for signaling the PQ event if the difference is greater than a predetermined threshold.

* * * * *